(12) United States Patent
Kim et al.

(10) Patent No.: US 7,378,223 B2
(45) Date of Patent: May 27, 2008

(54) PHOTORESIST RESIN COMPOSITION

(75) Inventors: Bong-gi Kim, Gyeonggi-Do (KR);
Sung-mun Ryu, Gyeonggi-Do (KR);
Seong-mo Park, Gyeonggi-Do (KR);
Chan-seok Park, Gyeonggi-Do (KR)

(73) Assignee: Dongjin Semichem, Co., Ltd. (KR)

( * ) Notice: Subject to any disclaimer, the term of this patent is extended or adjusted under 35 U.S.C. 154(b) by 399 days.

(21) Appl. No.: 11/124,224

(22) Filed: May 6, 2005

(65) Prior Publication Data

US 2005/0255405 A1     Nov. 17, 2005

(30) Foreign Application Priority Data

May 7, 2004   (KR)  ............... 10-2004-0032321

(51) Int. Cl.
*G03C 1/73*   (2006.01)
*G03C 1/76*   (2006.01)
*G03F 7/028*  (2006.01)
*G03F 7/09*   (2006.01)

(52) U.S. Cl. ............... 430/284.1; 430/271.1; 430/273.1; 430/311; 430/325; 430/916; 430/920; 430/923; 430/922; 430/924

(58) Field of Classification Search ............ None
See application file for complete search history.

(56) References Cited

U.S. PATENT DOCUMENTS 4,458,007 A * 7/1984 Geissler et al. .......... 430/284.1

* cited by examiner

*Primary Examiner*—Sin Lee
(74) *Attorney, Agent, or Firm*—Cantor Colburn LLP

(57) ABSTRACT

The invention provides photoresist resin compositions and in particular, a photoresist resin compositions comprising a) an acrylate monomer having two urethane bonds, b) a crosslinkable urethane monomer having at least two ethylene double bonds, c) an alkali-soluble compound, d) a photopolymerization initiator and e) a solvent, and a photoresist dry film resists using the photoresist resins. The photoresist resin compositions and the photoresist dry film resists using the same in accordance with the invention have excellent adhesion to a substrate and sandblast resistance and at the same time, they have high sensitivity as well as high resolution, thereby enabling fine pattern formation on substrates.

13 Claims, 1 Drawing Sheet

PHOTORESIST RESIN COMPOSITION

BACKGROUND OF THE INVENTION

1. Field of the Invention

The present invention relates to photoresist resin compositions and in particular, to photoresist resin compositions having excellent adhesion to substrates and sandblast resistance and at the same time, having high sensitivity as well as high resolution thereby enabling fine pattern formation on substrates and photoresist dry film resists using the photoresist resins.

2. Description of Related Art

For pattern formation, relief pattern is often used on the surface of substrates in manufacture of electronic devices such as plasma display panels (PDP) and circuit substrates. As one of such relief pattern formation, there is a sandblast etching method comprising by forming a photoresist resin membrane on the surface of a substrate, forming a pattern resist layer thereon by photolithography, and etching an exposed or non-mask area of the surface of the substrate by sandblast where abrasion particles are sprayed over surfaces.

Dry film resists are widely used as a basic material for formation of pattern in manufacture of electronic devices. Particularly, conversion of regions which were made from liquid resin composition in past into dry film resists has been actively attempted and recently, for pattern formation of PDP, film resists are being frequently used.

Usually, acrylates were used as a monomer for the dry film resists used in pattern formation of PDP, but due to their poor sandblast resistance, it was difficult to obtain fine pattern formation.

Also, dry film resists using urethane acrylate oligomers or monomers in excessive amount were suggested, but they have less sensitivity than the dry film resists using acrylates and also have unsatisfactory adhesion to substrates and resolution.

SUMMARY OF THE INVENTION

Therefore, it is an object of the invention to provide a photoresist resin composition having improved adhesion to a substrate and sandblast resistance and at the same time, having high sensitivity as well as high resolution thereby enabling fine pattern formation on substrate, and a photoresist dry film resist and a method of forming pattern on the surface of substrate using the same.

In order to achieve the aforementioned object, the present invention provides a photoresist resin composition comprising:
  a) 1 to 30% by weight of an acrylate monomer having two urethane bonds;
  b) 10 to 60% by weight of a crosslinkable urethane monomer having at least two ethylene double bonds;
  c) 5 to 15% by weight of an alkali-soluble compound;
  d) 0.5 to 10% by weight of a photopolymerization initiator; and
  e) a solvent in the remaining amount.

Also, the invention provides a photoresist dry film resist comprising a photoresist resin membrane obtained by coating the photoresist resin composition onto a substrate film and drying it.

Further, the invention provides a method of forming pattern on the surface of a substrate with a photoresist resin composition, wherein the improvement comprises forming a photoresist resin membrane by drying the photoresist resin composition over the surface of the substrate.

Further, the invention provides a method of forming pattern on the surface of a substrate with a photoresist dry film resist, wherein the improvement comprises mounting a photoresist resin membrane obtained by taking off a substrate film from the photoresist dry film resist on the surface of the substrate and adhering it.

Figure 1:
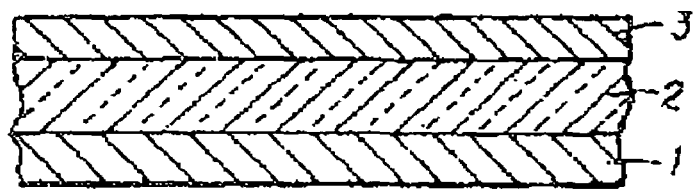
FIG. 1 is a longitudinal section of a photoresist dry film resist according to an embodiment of the present invention.

1: Substrate film
2: Photoresist resin membrane
3: Protective film

DETAILED DESCRIPTION OF THE INVENTION

The invention is further described in detail.

A photoresist resin composition in accordance with the present invention comprises a) 1 to 30% by weight of an acrylate monomer having two urethane bonds, b) 10 to 60% by weight of a crosslinkable urethane monomer having at least two ethylene double bonds, c) 5 to 15% by weight of an alkali-soluble compound, d) 0.5 to 10% by weight of a photopolymerization initiator, and e) a solvent in the remaining amount.

The acrylate monomer having two urethane bonds of a) in the invention is preferably represented as formula 1:

$$\begin{aligned} &H_2C{=}C(R_3){-}\overset{O}{\overset{\|}{C}}{-}OC_2H_4{-}\overset{H}{\overset{|}{N}}{-}\overset{O}{\overset{\|}{C}}{-}OC_2H_4{-}(OC_2H_4)_n{-}O{-}\overset{O}{\overset{\|}{C}}{-}R_1{-} \\ &{-}\overset{O}{\overset{\|}{C}}{-}O{-}(C_2H_4O)_n{-}C_2H_4O{-}\overset{O}{\overset{\|}{C}}{-}\overset{H}{\overset{|}{N}}{-}C_2H_4O{-}\overset{O}{\overset{\|}{C}}{-}C(R_2){=}CH_2 \end{aligned}$$

wherein:
  R1 is an aromatic group or alkyl group,
  R2 and R3 are each independently a hydrogen or methyl group, and
  n is an integer of 0 to 10.

The acrylate monomer represented by formula 1 can be prepared by reacting dibasic acids and ethylene oxides thereby producing an oligomer with hydroxy groups at its both terminals and then reacting the oligomer having hydroxy groups at its both terminals and an acrylate monomer having isocyanate group.

For example, 2-isocyanatoethyl(meth)acrylate can be used as the acrylate monomer having isocyanate group.

Also, a Sn catalyst may be used in the reaction of the oligomer with hydroxy groups at its both terminals and the acrylate monomer having isocyanate group and the reaction is preferably carried out at least 60° C. for high yield.

Preferably, the acrylate monomers have an average molecular weight of 1,000 to 10,000. When the average molecular weight is within the above ranges, satisfactory sandblast resistance and development are achieved.

The photoresist resin compositions of the invention preferably comprise the acrylate monomers in an amount of 1 to 30% by weight. When the amount is within the above range, sandblast resistance and development are good.

For the crosslinkable urethane monomer of b) in the invention, urethane (meth)acrylate oligomers can be prepared by reacting the reaction product obtained by reaction of diisocyanate compounds and diol compounds with (meth) acrylate compounds having an hydroxyl group or carboxyl group.

For the diisocynate compounds, aromatic or aliphatic diisocyanates such as dimethylene diisocynate, trimethylene diisocyanate, tetramethylene diisocyanate, pentamethylene diisocyanate, hexamethylene diisocyanate, heptamethylene diisocyanate and 2,2,4-trimethylhexane diisocyanate can be used alone or in a mixture thereof.

For the diol compounds, alkylene glycols such as 1,4-butadiol, ethylene glycol, propylene glycol, diethylene glycol, triethylene glycol, dipropylene glycol and neopentyl glycol, maleic anhydride, fumaric acid, adipic acid, pyromalic acid, caprolactone or propiolactone can be used alone or in a mixture thereof.

For the (meth)acrylate compounds having hydroxyl group or carboxyl group, hydroxy methyl methacrylate, hydroxy methyl acrylate, 2-hydroxy ethyl acrylate, 2-hydroxy ethyl methacrylate, 3-hydroxy propyl methacrylate, acrylic acid, methacrylic acid or phthalic acid monohydroxy ethyl acrylate can be used alone in a mixture thereof.

The crosslinkable urethane monomers have preferably an average molecular weight of 1,000 to 3,000. When the average molecular weight is less than 1,000, sufficient elasticity is not obtained due to the increased hardness of film after hardening process, which results in poor sandblast resistance. When it exceeds 30,000, the viscosity of photoresist resins increases thereby causing coating performance to be deteriorated, and development properties decrease thereby making fine pattern formation difficult.

The photoresist resin compositions of the invention preferably comprise the crosslinkable urethane monomers in an amount of 10 to 60% by weight. When the amount is within the above ranges, satisfactory sandblast resistance and development are achieved.

For the alkali-soluble compound of c) in the invention, cellulose acetate phthalate (CAP), hydroxy propyl methyl cellulose phthalate (HPMCP), or ethyl hydroxy ethyl cellulose phthalate (EHECP) can be used.

The photoresist resin compositions of the invention preferably comprise the alkali-soluble compounds in an amount of 5 to 15% by weight. When the amount is less than 5% by weight, it is difficult to form desirable fine pattern, and when it exceeds 15% by weight, sufficient sandblast resistance is not obtained due to the increased hardness of the film formed.

For the photopolymerization initiators of d) in the invention, one or more triazines, benzoines, acetophenones, imidazoles, phosphine oxides, or xanthones can be used. In particular, 2,4-bistrichloromethyl-6-p-methoxystyl-s-triazine, 2-p-methoxystyl-4,6-bistrichloromethyl-s-triazine, 2,4-trichloromethyl-6-triazine, 2,4-trichloromethyl-4-methylnaphtyl-6-triazine, benzophenone, p-(diethylamino) benzophenone, 2,2-dichloro-4-phenoxyacetophenone, 2,2'-diethoxyacetophenone, 2,2'-dibutoxyacetophenone, 2-hydroxy-2-methylproliophenone, p-t-butyltrichloroacetophenone, diphenyl(2,4,6-trimethylbenzoyl)phosphine oxide, bis(2,4,6-trimethylbenzoyl)phenyl phosphine oxide, 2-methylthioxanthone, 2-isobutylthioxanthone, 2-dodecylthioxanthone, 2,4-dimethylthioxanthone, 2,4-diethylthioxanthone, and 2,2'-bis-2-chlorophenyl-4,5,4,5'-tetraphenyl-2-1,2'-biimidazole compound can be used alone or in a mixture thereof.

The photoresist resin compositions of the invention comprise the photopolymerization initiators preferably in an amount of 0.5 to 10% by weight and more preferably, in an amount of 1 to 4% by weight. When the amount is less than 0.5% by weight, normal pattern formation is difficult due to low sensitivity and the straightness of pattern is not good, and when it exceeds 10% by weight, preservation might be unstable and rip-off of pattern may be deteriorated in the process of development due to high hardening rate.

The solvents of e) are included in the remaining amount in the photoresist resin compositions in the invention and can be employed in consideration with solubility or coating performances.

For the solvents, ethylene glycol monomethyletheracetate, propylene glycol monomethylether, propylene glycol methyletheracetate, propylene glycol monoethyletheracetate, diethylene glycol dimethylether, diethylene glycol methylethylether, cyclohexanone, ethyl 3-methoxy propionate, methyl 3-ethoxy propionate, ethyl 3-ethoxy propionate, methylethylketone, isopropylalcohol, ethanol, or methanol can be used alone or in a mixture thereof.

The photoresist resin compositions in the invention may further comprise additives such as dyes, color developers, polymerization inhibitors, surfactants or plasticizers, if necessary.

Usually, the additives can be added within 0.1 to 10% by weight of the photoresist resin compositions.

Particularly, for the dyes or color developers, leuco crystal violet, tribromo methyl phenyl sulfone, diamond green GH, rhodamine B, auramine base, paramagenta, methyl orange, methylene blue, crystal violet, ethyl violet, phthalocyanine green, or basic dyes such as chic blue 20 and night green B can be used.

For the polymerization inhibitors, there can be used tri-p-nitrophenylmethyl, p-benzoquinone, p-tert-butylcathecol, or dithiobenzoyldisulfide. For the surfactants, anionic, cationic, or amphoteric surfactants such as alkyl sulfonates, alkyl phosphates, aliphatic amine salts and amino carboxylates can be used.

Further, the invention provides a photoresist dry film resist comprising a photoresist resin membrane obtained by coating the photoresist resin composition onto a substrate film and drying it and for the substrate film, polyethylene terephthalate (PET) film can be used.

The photoresist resin compositions can be coated onto the substrate film and dried in accordance with conventional coating and dry methods which are used in manufacture of dry film resists. The thickness of the photoresist resin membrane can be adjusted, depending on the purpose of use, by persons skilled in the art. However, it is preferable that the thickness of the photoresist resin membrane is not less than 40 µm to achieve good sandblast resistance.

The photoresist dry film resists can further comprise a protective film over the photoresist resin membrane for the protection of the photoresist resin membrane as shown in FIG. 1. It is preferable that the protective film is polyethylene (PE) film.

Further, the invention provides a method of forming pattern on the surface of a substrate, wherein the improvement comprises forming a photoresist resin membrane by drying the photoresist resin composition over the surface of the substrate, in which the formation of the photoresist resin membrane on the surface of the substrate can be carried out either by coating the photoresist resin composition of the invention directly onto the surface of the substrate and drying it, or by mounting an photoresist resin membrane obtained by taking off a substrate film from the photoresist dry film resist of the invention on the surface of the substrate and adhering it. A PDP barrier rib formation is preferred for the pattern formation of the substrates.

It is preferable that the photoresist resin membrane is formed using the photoresist dry film resist and heat press system is used for the adhesion.

After the photoresist resin membrane of the invention is formed on the substrate, conventional relief pattern fabrication can be employed for the pattern formation of the surface of the substrate. For instance, barrier rib fabrication for PDP is carried out by the following process. First, the photoresist dry film resists of the invention are laminated on a PDP material on which barrier rib materials are printed using a hot roller. It is preferable that the photoresist resin membranes of the photoresist dry film resists are being laminated on the barrier rib materials while taking off protective films from the photoresist dry film resists. Preferably, this lamination process is carried out at 100 to 130° C. After the lamination process, the substrates are subject to be exposed to light with regard to the photoresist resin membranes using a photomask where circuit patterns are formed and then, unexposed portions are removed by development process. Preferably, alkali developers are used for the development process in the present invention, and any conventional alkali developers can be employed. The photoresist resin membranes of the unexposed portions are washed off during the development process and the hardened photoresist resin membranes remain on the surface of the barrier rib materials. Thereafter, the substrates with patterned photoresist resin membranes form barrier rib patterns by sandblasting process. The photoresist resin membranes formed on the barrier rib materials act as protective membranes in this sandblasting process by preventing the barrier rib materials from being cut off. Then, the patterned photoresist resin membranes are removed by peeling process and the barrier rib materials are plasticized whereby barrier rib fabrication is completed.

The pattern formation with the dry film resists of the invention has good adhesion of the photoresist dry film resists and PDP barrier rib materials to the substrates, improves sandblast resistance and at the same time, has high resolution thereby enabling fine pattern formation.

For better understanding of the present invention, preferred embodiments follow. The following examples are intended to illustrate the invention more fully without limiting the scope of the invention.

EXAMPLES 1~4 AND COMPARATIVE EXAMPLES 1~3

(Preparation of Acrylate Monomers having Two Urethane Bonds)

The acrylate monomers having two urethane bonds represented by formula 1 were prepared by polymerization with compositions and amounts as shown in Table 1 below. In the polymerization, propylene glycol monomethylether acetate (PGMEA) was used as solvent in an amount of 30% by weight and as catalysts, Lewis acid and Sn were employed.

TABLE 1

|      | Monomer 1 | Monomer 2 | Monomer 3 |
|------|-----------|-----------|-----------|
| HHPA | 12        | 15        | 18        |
| EO   | 36        | 28        | 20        |
| IEM  | 22        | 27        | 32        |

(Note)
HHPA: Hexahydro phthalic acid
EO: Ethylene oxide
IEM: 2-isocyanatoethyl methacrylate (Preparation of Photoresist Resin Compositions)

The photoresist resins of Examples 1 to 4 and Comparative Examples 1 to 3 were prepared by mixing the above-prepared acrylate monomers having two urethane bonds, crosslinkable urethane monomers, alkali-soluble compounds, photopolymerization initiators, dyes and solvents with the compositions and amounts as shown in Table 2 below, and stirring the mixture at room temperature for two hours. The photoresist resins thus prepared were filtrated with 500 meshes to remove impurities whereby final photoresist resins were obtained.

TABLE 2

|   | Wt. % | No. of Examples | | | | No. of Com. Examples | | |
|---|-------|---|---|---|---|---|---|---|
|   |       | 1 | 2 | 3 | 4 | 1 | 2 | 3 |
| A | Monomer 1 | 10 | — | — | 10 | — | — | 20 |
|   | Monomer 2 | — | 10 | — | — | — | — | — |
|   | Monomer 3 | — | — | 10 | — | — | — | 20 |
| B | SC-2703 | 30 | 30 | 30 | — | 40 | — | — |
|   | TX-46 | — | — | — | 30 | — | 40 | — |
|   | Alkali-soluble compound | 10 | 10 | 10 | 10 | 10 | 10 | 10 |
|   | Photopolymerization initiator | 1.5 | 1.5 | 1.5 | 1.5 | 1.5 | 1.5 | 1.5 |
|   | Dye | 0.5 | 0.5 | 0.5 | 0.5 | 0.5 | 0.5 | 0.5 |
|   | Solvent | 48 | 48 | 48 | 48 | 48 | 48 | 48 |

Note
A: Acrylate monomer having two urethane bonds (containing PGMEA 30%)
B: Crosslinkable urethane monomer (SC-2703: Miwon Commercial Co., Ltd., TX-46: Negami Chemistry)
Alkali-soluble compound: CAP(Cellolose acetate phthalate, Waco Pure Chemical)
Photopolymerization initiator: BASF, Lucirin ® TPO
Solvent: MEK(Methyl ethyl ketone)

After the photoresist resins prepared in above Examples 1 to 4 and Comparative Examples 1 to 3 were dried, they were coated onto polyethylene terephthalate film (PET film) of 25 µm using Applicator until the thickness of membranes became 40 µm and then dried to form photoresist resin membranes. Thereafter, polyethylene film (PE film) of 20 µm was bonded to the dried photoresist resin membranes using a rubber roller until no bubbles appeared to make photoresist dry film resists.

Figure 2:
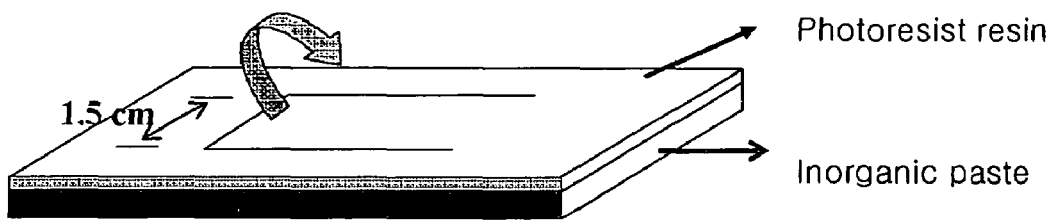
FIG. 2 is a schematic diagram illustrating adhesion test of a photoresist resin membrane to a substrate.

Adhesion to substrates, resolution, sandblast resistance and peeling were tested using the photoresist dry film resists prepared above.

a) Adhesion—After the PE films were taken off the photoresist dry film resists prepared above and the photoresist resin membranes were pressed to substrates using hot roll of 105° C., they were entirely exposed to 300 mJ/cm², PET films were taken off, and the photoresist resin membranes were cut into pieces so as to become the same size as an adhesion tape (width 1.5 cm) before peeling test was conducted as shown in FIG. 2. The adhesion strength to be measured here is relative adhesion among the photoresist resins and it does not mean absolute adhesion.

TABLE 3

| | No. of Examples | | | | No. of Com. Examples | | |
|---|---|---|---|---|---|---|---|
| | 1 | 2 | 3 | 4 | 1 | 2 | 3 |
| Adhesion | 100 $g_1/cm^2$ | 86 $g_1/cm^2$ | 68 $g_1/cm^2$ | 98 $g_1/cm^2$ | 55 $g_1/cm^2$ | 54 $g_1/cm^2$ | 123 $g_1/cm^2$ |

As seen in above Table 3, the dry film resists using the photoresist resins prepared in Examples 1 to 4 in accordance with the present invention had excellent adhesion, compared with those in Comparative Examples 1 to 2.

b) Resolution—As to the above-prepared photoresist dry film resists with membrane thickness of 40 μm after dry, resolutions after development and after sandblasting were measured and the results were exhibited in Table 4 below. For resolution test after development, 0.4% solution of $Na_2CO_3$ was used at 30° C. for 60 seconds, and for resolution after sandblasting, SiC was used as an abrasive at pressure of 4 $kg_1/cm^2$ for 50 seconds and then minimum linewidth without pattern dropout was measured.

c) Peeling—For peeling against alkali, 0.4% solution of MEA was used at 55° C. for 40 seconds and the results were shown in Table 4 below (○: Excellent, Δ: Normal(after peeling, organic materials in small amount exist), ×: Poor (after peeling, organic materials in large amount exist).

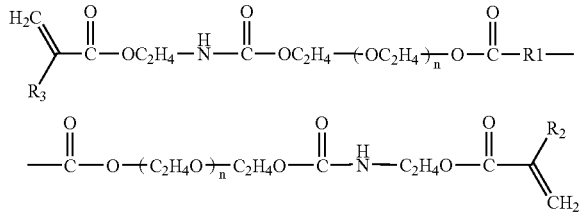

wherein:

R1 is an aromatic group or alkyl group,

R2 and R3 are each independently a hydrogen or methyl group, and n is an integer of 0 to 10.

TABLE 4

| | | No. of Examples | | | | No. of Com. Examples | | |
|---|---|---|---|---|---|---|---|---|
| | | 1 | 2 | 3 | 4 | 1 | 2 | 3 |
| Resolution | After development | 20 μm | 20 μm | 20 μm | 25 μm | 50 μm | 50 μm | 15 μm |
| | After sandblasting | 50 μm | 55 μm | 60 μm | 60 μm | 80 μm | 80 μm | 100 μm |
| | Peeling | ○ | ○ | ○ | ○ | ○ | ○ | Δ |

As shown in Table 4, the dry film resists using the photoresist resins prepared in Examples 1 to 4 in accordance with the present invention have excellent peeling and resolution after development as well as after sandblasting, compared with the dry film resists using the photoresist resins of Comparative Examples 1 to 3.

The photoresist resin compositions in accordance with the invention and dry film resists using the same improve adhesion to substrates and sandblast resistance and at the same time, have high sensitivity as well as high resolution thereby enabling fine pattern formation of substrates.

What is claimed is:

1. A photoresist resin composition comprising:
    a) 1 to 30% by weight of an acrylate monomer having two urethane bonds;
    b) 10 to 60% by weight of a crosslinkable urethane monomer having at least two ethylene double bonds;
    c) 5 to 15% by weight of an alkali-soluble compound;
    d) 0.5 to 10% by weight of a photopolymerization initiator; and
    e) a solvent in the remaining amount,
    wherein the acrylate monomer of a) is a compound represented by formula 1:

2. The photoresist resin composition of claim 1 wherein the arcylate monomer has an average molecular weight of 1,000 to 10,000.

3. The photoresist resin composition of claim 1 wherein the crosslinkable urethane monomer of b) is a urethane (meth)acrylate oligomer obtained by reacting the reaction product of a diisocyanate compound and a diol compound with a (meth)acrylate compound.

4. The photoresist resin composition of claim 1 wherein the crosslinkable urethane monomer has an average molecular weight of 1,000 to 30,000.

5. The photoresist resin composition of claim 1 wherein the alkali-soluble compound of c) is selected from the group consisting of cellulose acetate phthalate (CAP), hydroxy propyl methyl cellulose phthalate (HPMCP), and ethyl hydroxy ethyl cellulose phthalate (EHECP), and a combination thereof.

6. The photoresist resin composition of claim 1 wherein the photopolymerization initiator of d) is selected from the group consisting of 2,4-bistrichloromethyl-6-p-methoxystyl-s-triazine, 2-p-methoxystyl-4,6-bistrichloromethyl-s-triazine, 2,4-trichloromethyl-6-triazine, 2,4-trichloromethyl-4-methylnaphtyl-6-triazine, benzophenone, p-(diethylamino)benzophenone, 2,2-dichloro-4-phenoxyacetophenone, 2,2'-diethoxyacetophenone, 2,2'-dibutoxyacetophenone, 2-hydroxy-2-methylproliophenone, p-t-butyltrichloroacetophenone, diphenyl (2,4,6-trimethylbenzoyl)

phosphine oxide, bis(2,4,6-trimethylbenzoyl) phenyl phosphine oxide, 2-methylthioxanthone, 2-isobutylthioxanthone, 2-dodecylthioxanthone, 2,4-dimethylthioxanthone, 2,4-diethylthioxanthone, 2,2'-bis-2-chlorophenyl-4,5,4',5'-tetraphenyl-2'-1,2'-biimidazole compound and a combination thereof.

7. The photoresist resin composition of claim 1 further comprising a dye, a color developer, a polymerization inhibitor, a surfactant, or a plasticizer.

8. A photoresist dry film resist comprising a photoresist resin membrane obtained by coating the photoresist resin composition according to claim 1 onto a substrate film and drying it.

9. The photoresist dry film resist of claim 8 further comprising a heteroflim layer over the photoresist resin membrane.

10. A method of forming pattern on a surface of a substrate with a photoresist dry film resist, comprising:

mounting a photoresist resin membrane obtained by taking off a substrate film from the photoresist dry film resist of claim 8 on the surface of the substrate and adhering it.

11. The method of forming pattern on the surface of a substrate-of claim 10 wherein the substrate is a plasma display panel (PDP).

12. A method of forming pattern on a surface of a substrate with a photoresist resin composition, comprising:

forming a photoresist resin membrane by drying the photoresist resin composition of claim 1 over the surface of the substrate.

13. The method of forming pattern on the surface of a substrate of claim 12 wherein the substrate is a plasma display panel (PDP).

* * * * *